United States Patent
Shi et al.

(10) Patent No.: US 7,158,762 B2
(45) Date of Patent: Jan. 2, 2007

(54) DIRECT CONVERSION RF TRANSCEIVER WITH AUTOMATIC TRANSMIT POWER CONTROL

(75) Inventors: Zhongming Shi, San Diego, CA (US); Ahmadreza Rofougaran, Marina Del Ray, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 527 days.

(21) Appl. No.: 10/340,419

(22) Filed: Jan. 10, 2003

(65) Prior Publication Data

US 2004/0137852 A1   Jul. 15, 2004

Related U.S. Application Data

(63) Continuation-in-part of application No. 10/274,655, filed on Oct. 21, 2002, now Pat. No. 7,020,449, and a continuation-in-part of application No. 10/255,378, filed on Sep. 26, 2002, and a continuation-in-part of application No. 10/052,870, filed on Jan. 18, 2002.

(51) Int. Cl.
   *H04B 1/40* (2006.01)
(52) U.S. Cl. .............. 455/84; 455/127.2; 455/115.1; 455/232.1; 455/324
(58) Field of Classification Search ............. 455/73, 455/84, 85, 86, 126, 127.2, 3, 115.1, 232.1, 455/324; 330/289, 291, 140, 129
See application file for complete search history.

(56) References Cited

U.S. PATENT DOCUMENTS

| 4,542,324 A * | 9/1985 | Leuthen ................... 318/798 |
| 6,242,976 B1 * | 6/2001 | Yuen et al. ............. 330/289 X |
| 6,677,823 B1 * | 1/2004 | Terosky et al. ............. 330/289 |
| 2003/0179040 A1 * | 9/2003 | Kossor ..................... 330/136 |
| 2004/0203472 A1 * | 10/2004 | Chien .................. 455/232.1 X |

* cited by examiner

*Primary Examiner*—Matthew D. Anderson
*Assistant Examiner*—Philip J. Sobutka
(74) *Attorney, Agent, or Firm*—Garlick Harrison & Markison; James A. Harrison

(57) ABSTRACT

A single chip radio transceiver includes circuitry that enables received RF signals to be down-converted to baseband frequencies and baseband signals to be up-converted to RF signals prior to transmission without requiring conversion to an intermediate frequency. The circuitry includes a low noise amplifier, automatic frequency control circuitry for aligning the LO frequency with the frequency of the received RF signals, received signal strength indicators for adjusting frontal and rear amplification stages accordingly, and, finally, filtering circuitry to filter high and low frequency interfering signals, including DC offset. A radio frequency (RF) variable gain amplifier (VGA) includes a power amplifier in a direct conversion radio transceiver that includes a gain determination module that reduces an input gain level to the power amplifier to adjust the output power level of the power amplifier according to temperature indications to maintain reliable operation or power level indications to maintain a constant output power level.

19 Claims, 9 Drawing Sheets

DIRECT CONVERSION RF TRANSCEIVER WITH AUTOMATIC TRANSMIT POWER CONTROL

CROSS-REFERENCE TO RELATED APPLICATION(S)

This application claims priority to under 35 U.S.C. §120 and incorporates by reference and is a continuation-in-part of U.S. Utility Application entitled, "Local Oscillator Frequency Correction in a Direct Conversion RF Transceiver" having a Ser. No. of 10/255,378 and a filing date of Sept. 26, 2002, and U.S. Utility Application entitled, "A Direct Conversion RF Transceiver for Wireless Communications", having a Ser. No. of 10/052,870 and a filing date of Jan. 18, 2002, and U.S. Utility Application entitled, "RF Variable Gain Amplifier with Fast Acting DC Offset Cancellation", having a Ser. No. of 10/274,655 and a filing date of Oct. 21, 2002.

BACKGROUND OF THE INVENTION

1. Field of the Invention

This invention relates generally to communication systems and, more particularly, to Radio Frequency (RF) signal amplification within wireless devices operating in wireless communication systems.

2. Background of the Invention

Communication systems are known to support wireless and wire lined communications between wireless and/or wired communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocol (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel of the other parties (e.g., one of the plurality of radio frequency (RF) carriers of the wireless communication system) and exchange information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wire lined or wireless network.

Each wireless communication device includes a built-in radio transceiver (i.e., receiver and transmitter) or is coupled to an associated radio transceiver (e.g., a station for in-home and/or in-building wireless communication networks, RF modem, etc.) to participate in wireless communications. As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As is also known, the receiver is coupled to the antenna and includes a low noise amplifier (LNA), zero or more intermediate frequency (IF) stages, a filtering stage, and a data recovery stage in many designs. The low noise amplifier receives an inbound RF signal via the antenna and amplifies it. The down converters mix the amplified RF signal with one or more local oscillations to convert the amplified RF signal into a baseband signal or an intermediate frequency signal. As used herein, the term "low IF" refers to both baseband and low intermediate frequency signals. A filtering stage filters the low IF signals to attenuate unwanted out of band signals to produce a filtered signal. The data recovery stage recovers raw data from the filtered signal in accordance with the particular wireless communication standard.

There is a need today for a wireless transceiver system that allows for full integration of circuit designs that support high data rate and wideband communications. Stated differently, there is a need for wireless transceiver systems formed on an integrated circuit that have the capability to convert between baseband and a specified RF band in a single step to avoid the image rejection problems that are commonly known for IF approach. Thus, it is desirable to design direct conversion radio transceivers to allow a transceiver to be built on one integrated circuit without any image problem.

As the demand for enhanced performance (e.g., reduced interference and/or noise, improved quality of service, compliance with multiple standards, increased broadband applications, etc.), smaller sizes, lower power consumption, and reduced cost, wireless communication device engineers are faced with a very difficult design challenge to develop such a wireless communication device.

To minimize the size and number of discrete circuits within a device, there is a desire to incorporate power amplifiers into a single device an a radio transceiver integrated circuit or device. One problem with integrating radio transceiver circuits with power amplifiers, however, is that the power amplifiers generate significant temperatures that affect device reliability and/or operation. An additional need exists, therefore, for an integrated power amplifier within a transceiver device that addresses the various problems related to increased temperatures generated by the power amplifier of an integrated circuit or device. It is desired to monitor the temperature of the PA and to control the power level to prevent the integrated circuit from being overheated and reducing its reliability.

SUMMARY OF THE INVENTION

A radio frequency (RF) variable gain amplifier (VGA) includes a power amplifier in a direct conversion radio transceiver that includes a gain determination module that reduces an input gain level to the power amplifier (PA) to reduce an output power level of the power amplifier according to temperature indications. In one embodiment of the invention, the gain determination module adjusts input gain levels to compensate for power reduction that occurs as a result of increased temperatures so as to maintain a constant output power level. In another embodiment of the invention, or alternative, in another mode of operation of the invention, the gain determination module reduces the input gain level to the power amplifier to prompt it to produce lower output power so as to cause it to reduce its operational temperature and, therefore, to maintain highest reliability.

In one embodiment of the invention, a baseband processor includes the gain determination module and is coupled to receive the indication of the operating temperature from a temperature sensing module and the indication of the output power of the PA from a power sensing module, respectively. In one aspect of this embodiment of the invention, the baseband processor receives an indication of a user selected mode of operation indicating whether the gain determination module is to adjust the input gain level of the signal produced to the power amplifier to maintain a constant output power level or to adjust the operating temperature to prevent the power amplifier from overheating.

The radio transceiver further includes a plurality of adjustable gain elements that are coupled to receive gain level inputs from the gain determination module to increase or decrease gain level outputs responsive thereto. In one embodiment, the gain determination module generates a signal that is produced to each of the plurality of adjustable gain elements as a gain level input. In an alternate embodiment, the gain determination module generates a plurality of gain level inputs, one for each of the plurality of adjustable gain elements.

Finally, in an alternate embodiment of the invention, a plurality of gain level determination modules are provided. More specifically, a first gain level determination module is coupled to receive a temperature indication from a temperature sensing module while a second gain level determination module is coupled to receive a power level indication from a power level sensing module. Thus, in this embodiment, the first gain level determination module adjusts gain level inputs to the power amplifier to compensate for temperature while the second gain level determination module compensates for output power levels.

Other features and advantages of the present invention will become apparent from the following detailed description of the invention made with reference to the accompanying drawings.

DETAILED DESCRIPTION

Figure 1:
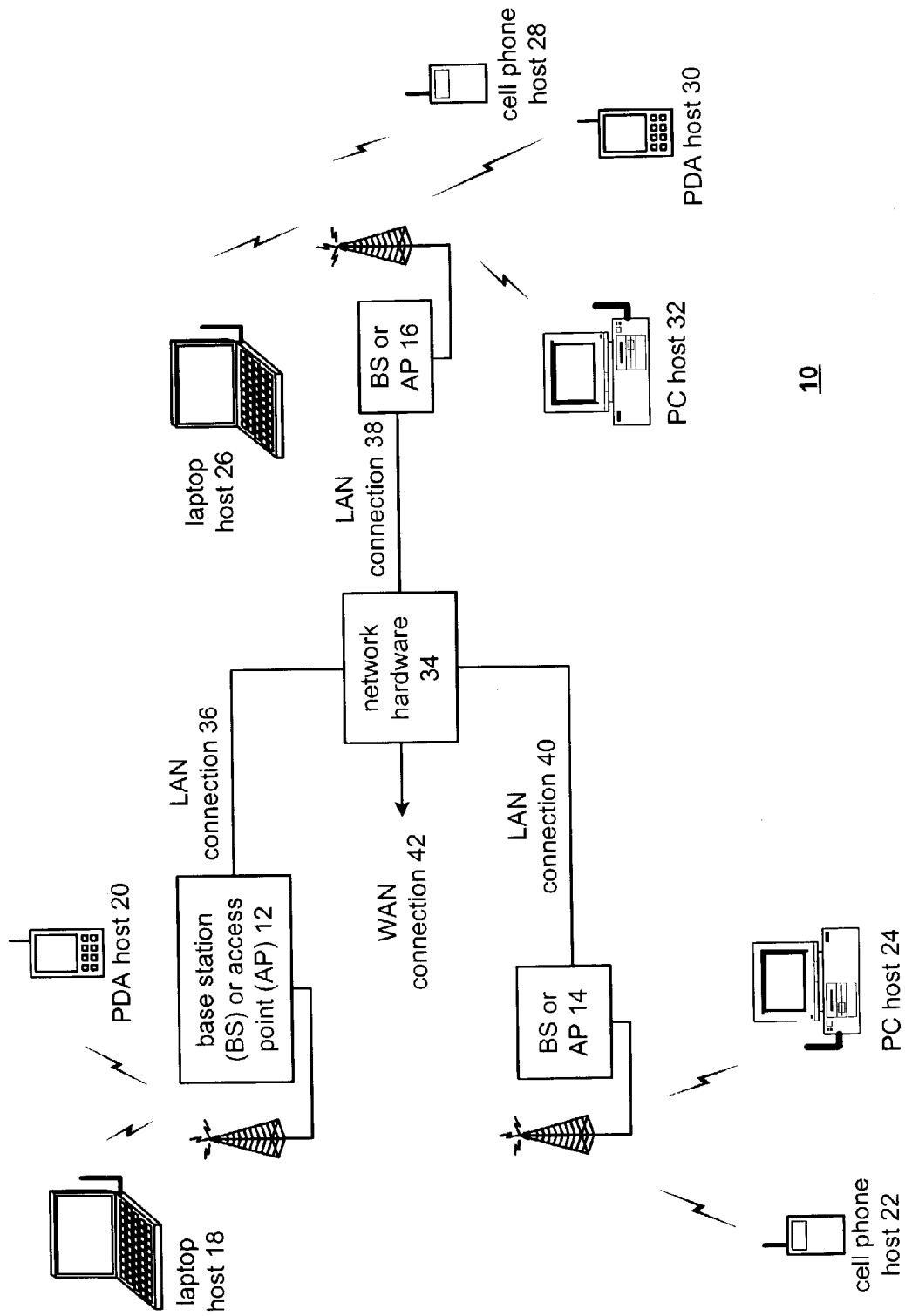
FIG. 1 is a schematic block diagram of a communication system that supports wireless communication devices in accordance with the present invention.

FIG. 1 is a schematic block diagram illustrating a communication system 10 that includes a plurality of base stations and access points 12–16, a plurality of wireless communication devices 18–32 and a network hardware component 34. The wireless plurality of communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10. Each of the plurality of base stations or access points 12–16 has an associated antenna or antenna array to communicate with the wireless communication devices in its area. Typically, the wireless communication devices register with a particular base station or access points 12–16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio may include a highly linear amplifier and/or programmable multi-stage amplifier as disclosed herein to enhance performance, reduce costs, reduce size, and/or enhance broadband applications.

Figure 2:
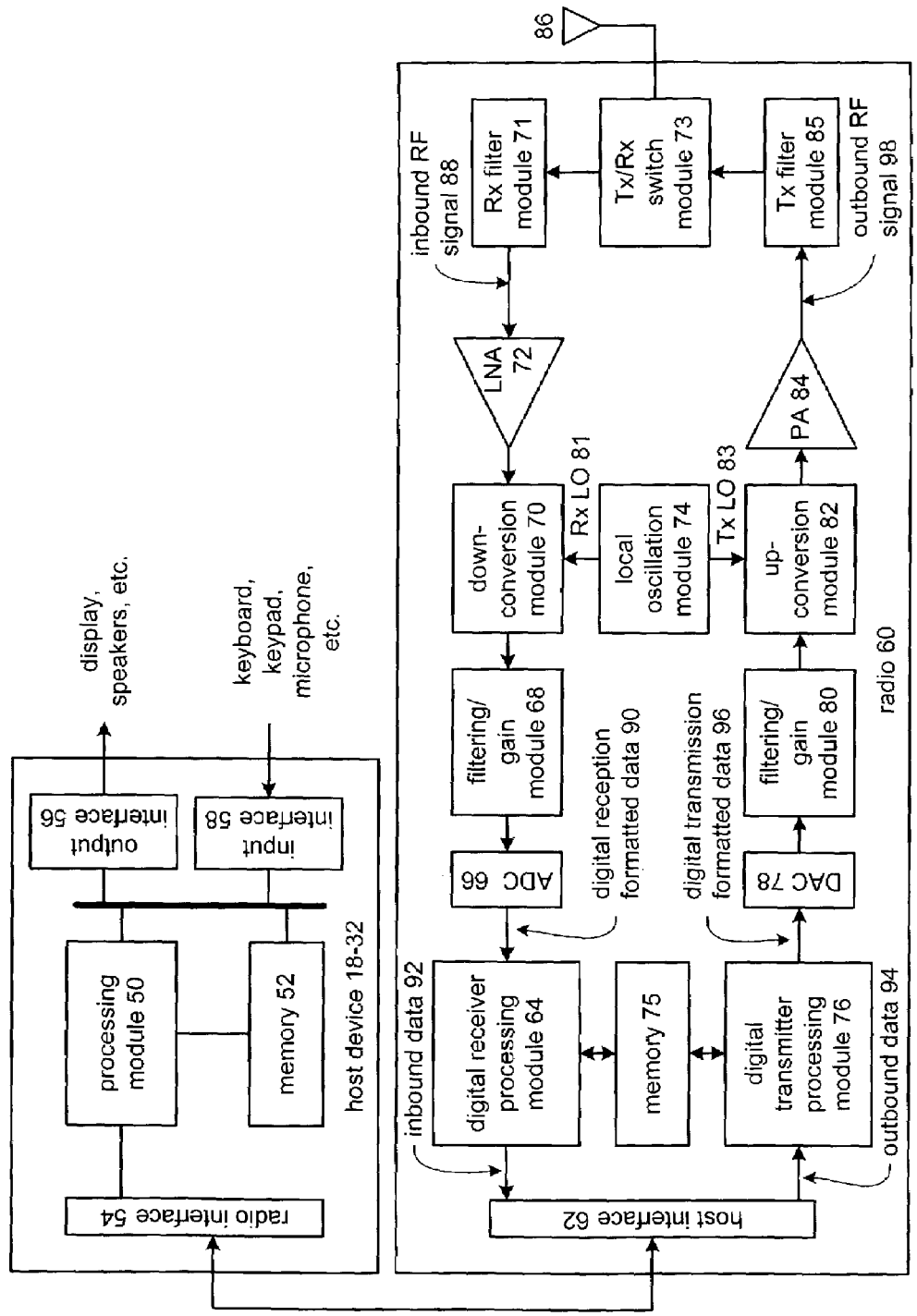
FIG. 2 is a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device 18–32. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a receiver filter module 71, a low noise amplifier 72, a transceiver/receiver module 73, a local oscillation module 74, memory 75, a digital transmitter processing module 76, a digital-to-analog converter 78, a filtering/gain module 80, an up-conversion module 82, a power amplifier 84, a transceiver filter module 85, and an antenna 86. The antenna 86 may be a single antenna that is shared by the transmit and receive paths as regulated by the transceiver/receiver module 73, or may include separate antennas for the transmit path and receive path. The antenna implementation will depend on the particular standard to which the wireless communication device is compliant. Filtering/gain module 68 includes logic and circuitry, including the invention described here in FIGS. 3–9.

The digital receiver processing module 64 and the digital transmitter processing module 76, in combination with operational instructions stored in memory 75, execute digital receiver functions and digital transceiver functions, respectively. The digital receiver functions include, but are not limited to, digital intermediate frequency to baseband conversion, demodulation, constellation demapping, decoding, and/or descrambling. The digital transceiver functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array (FPGA), programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory (ROM), random access memory (RAM), volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module. 64 and/or the digital transmitter processing module 76 executes, operational instructions corresponding to at least some of the functions illustrated in FIGS. 3–10.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF signal typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transceiver local oscillation 83 provided by local oscillation module 74. The power amplifier 84 amplifies the RF signal to produce outbound RF signal 98, which is filtered by the transceiver filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the transceiver/receiver module 73, where the receiver filter module 71 bandpass filters the inbound RF signal 88. The receiver filter module 71 provides the filtered RF signal to low noise amplifier 72, which amplifies inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation 81 provided by local oscillation module 74. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one skilled in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device 18-32 and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing modules 64 and 76.

Figure 3:
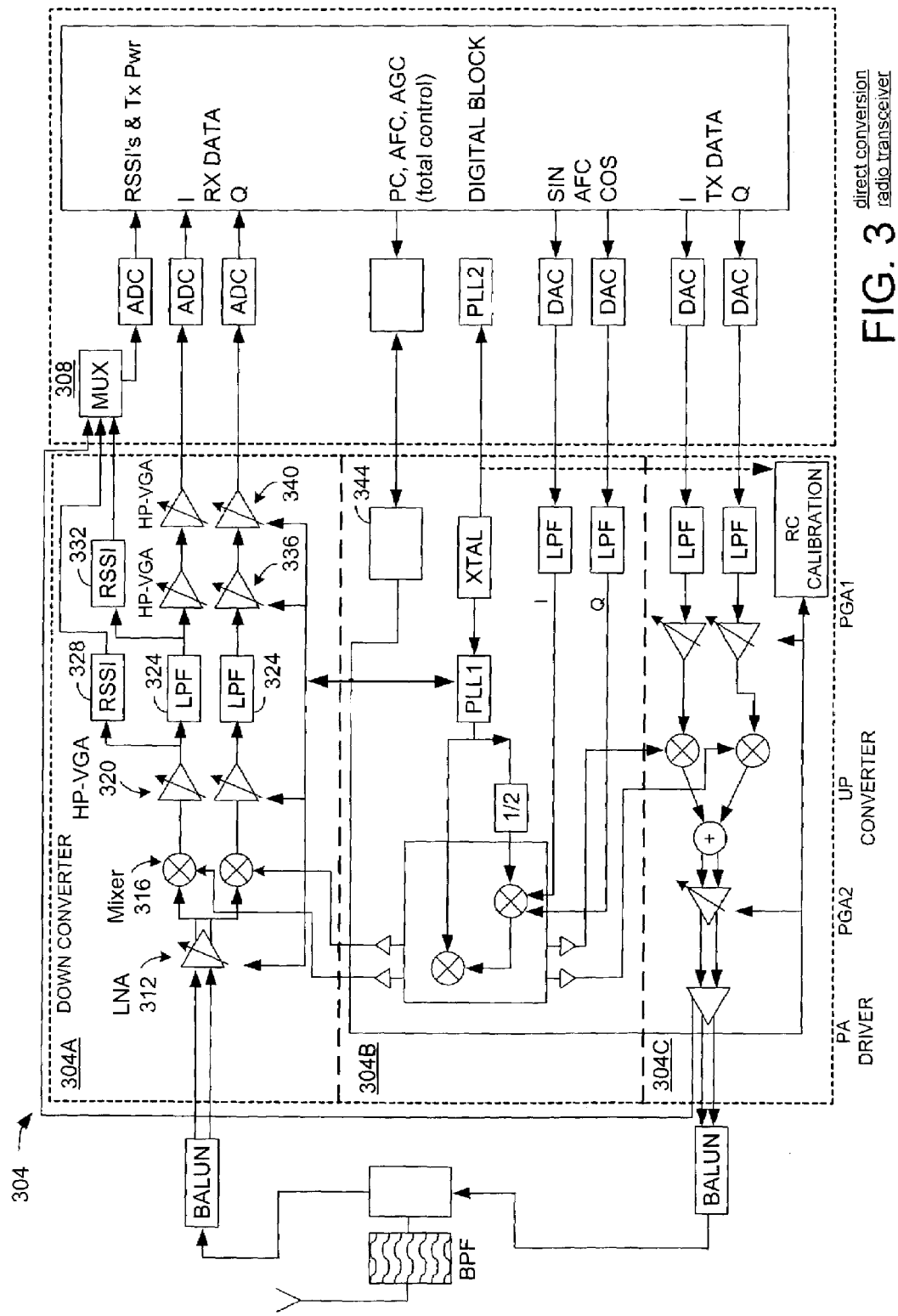
FIG. 3 is a functional schematic diagram of a direct conversion radio transceiver formed according to one embodiment of the present invention.

FIG. 3 is a functional schematic diagram of a direct conversion radio transceiver formed according to one embodiment of the present invention. Referring now to FIG. 3, a transceiver system comprises a single chip radio circuitry 304 that is coupled to baseband processing circuitry 308. The radio circuitry 304 performs filtering, amplification, frequency calibration (in part) and frequency conversion (down from the RF to baseband and up from baseband to the RF). Baseband processing circuitry 308 performs the traditional digital signal processing in addition to partially performing the automatic frequency control. As may be seen, the single chip radio circuitry 304 is coupled to receive radio signals that are initially received by the transceiver and then converted by a Balun signal converter, which performs single end to differential conversion for the receiver (and differential to single end conversion for the transceiver end). The Balun signal converters are shown to be off-chip in FIG. 3, but they may be formed on-chip with radio circuitry 304 as well. Similarly, while the baseband processing circuitry 308 is shown off-chip, it also may be formed on-chip with radio circuitry 304.

Radio circuitry 304 and, more particularly, circuitry portion 304A, includes a low noise amplifier 312 that is coupled to receive RF signals from a transceiver port. The low noise amplifier 312 then produces an amplified signal to mixers 316 that are for adjusting and mixing the RF with a local oscillation signal. The outputs of the mixers 316 (I and Q components of quadrature phase shift keyed signals) are then produced to a first HP-VGA 320. The outputs of the first HP-VGA 320 are then produced to a first RSSI 328, as well as to a low pass filter 324. The outputs of the low pass filter 324 are then produced to a second RSSI 332, as well as to a second HP-VGA 336 and a third HP-VGA 340 as may be seen in FIG. 3.

In operation, the first RSSI 328 measures the power level of the signal and interference. The second RSSI 332 measures the power level of the signal only. The baseband processing circuitry 308 then determines the ratio of the RSSI measured power levels to determine the relative gain level adjustments of the front and rear amplification stages. In the described embodiment of the invention, if the power level of the signal and interference is approximately equal to or slightly greater than the power level of the signal alone, then the first amplification stages are set to a high value and the second amplification stages are set to a low value. Conversely, if the power level of the signal and interference is significantly greater than the power of the signal alone, thereby indicating significant interference levels, the first amplification stages are lowered and the second amplification stages are increased proportionately.

Circuitry portion 304B includes low pass filters for filtering I and Q component frequency correction signals and mixer circuitry for actually adjusting LO signal frequency. The operation of mixers and phase locked loop for adjusting frequencies is known. Circuitry portion 304B further includes JTAG (Joint Test Action Group, IEEE1149.1 boundary-scan standard) serial interface (SIO) circuitry 344 for transmitting control signals and information to circuitry portion 304A (e.g., to control amplification levels) and to a circuitry portion 304C (e.g., to control or specify the desired frequency for the automatic frequency control).

A portion of the automatic frequency control circuitry that determines the difference in frequency between a specified center channel frequency and an actual center channel frequency for a received RF signal is formed within the baseband circuitry in the described embodiment of the invention. This portion of the circuitry includes circuitry that coarsely measures the frequency difference and then measures the frequency difference in the digital domain to obtain a more precise measurement and to produce frequency correction inputs to circuitry portion 304B. Finally, radio circuitry portion 304C includes low pass filtration circuitry for removing any interference that is present after baseband processing, as well as amplification, mixer and up-converter circuitry for preparing a baseband signal for transmission at the RF.

The direct conversion radio transceiver of FIG. 3 is provided to illustrate one embodiment of the invention of a direct conversion radio transceiver. While not all of the disclosed and claimed circuit elements are shown specifically in FIG. 3, it is understood that the inventive circuitry disclosed herein is implemented within a direct conversion radio transceiver as shown herein FIG. 3. For example, the disclosed and claimed circuit elements are coupled to and operate within a system similar to this shown in FIG. 3. The HP-VGAs 320 and/or 336 and 340 are coupled to receive gain level control inputs from a gain determination circuit. The gain determination circuit is coupled to receive at least one of a temperature indication from a temperature detector or an output power indication from a power detector as a part of determining the gain level control input, as is described in greater detail herein.

Figure 4:
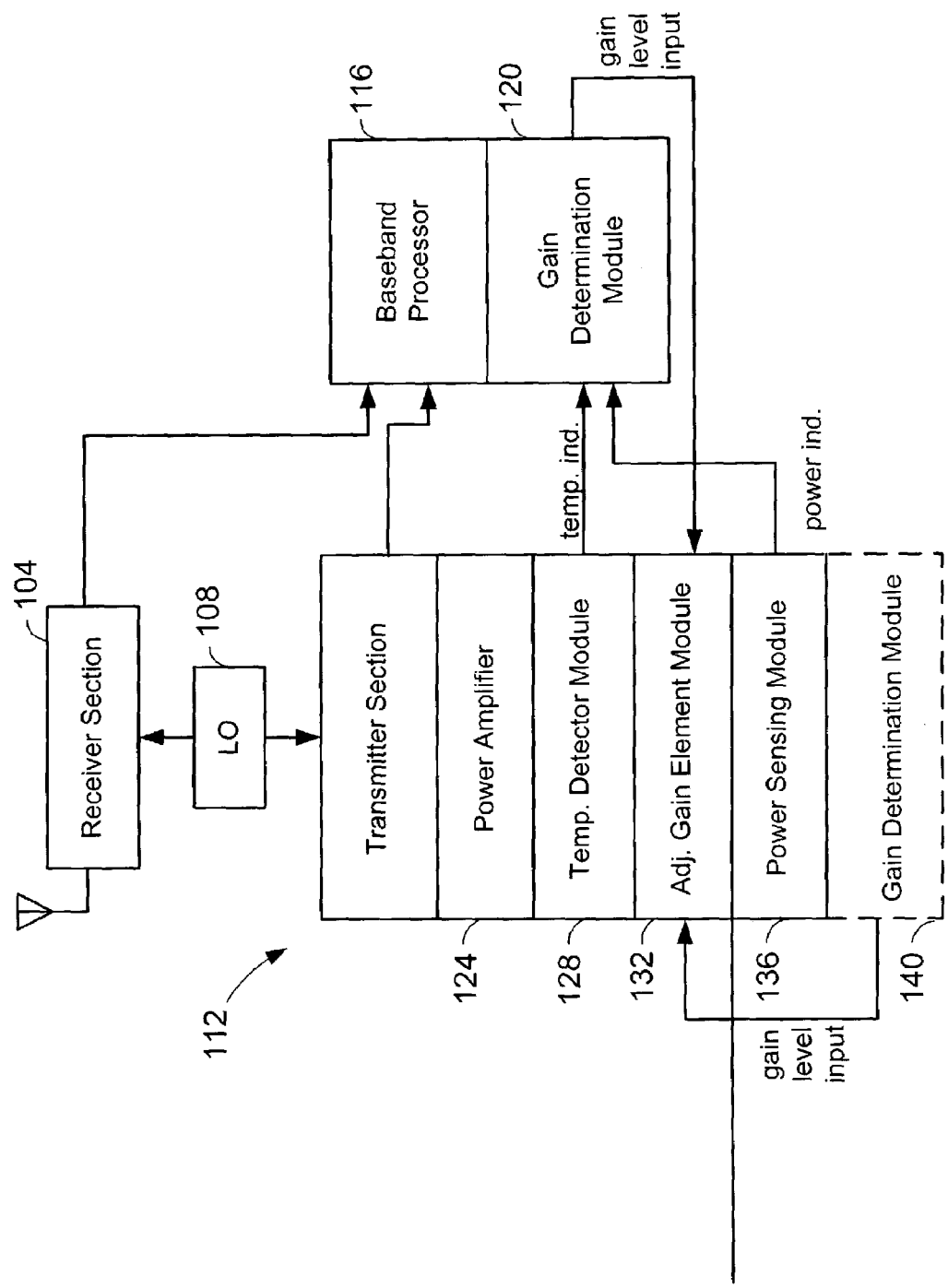
FIG. 4 is a functional block diagram of a direct conversion radio frequency (RF) transceiver integrated circuit formed according to one embodiment of the present invention.

FIG. 4 is a functional block diagram of a direct conversion radio frequency (RF) transceiver integrated circuit formed according to one embodiment of the present invention. The direct conversion RF transceiver includes a receiver section 104 that is coupled to receive a local oscillation from a local oscillator 108. The direct conversion RF transceiver further includes a transmitter section shown generally at 112 that also is coupled to receive a local oscillation from local oscillator 108. The direct conversion RF transceiver also includes a baseband processor 116 that further includes a gain determination module 120. Gain determination module 120 is for determining and generating a gain level input that is provided to an adjustable gain element. Gain determination module 120 determines gain based upon at least one of a detected power level and a detected temperature of a power amplifier.

Transmitter section 112 includes a power amplifier 124, a temperature sensor module 128, an adjustable gain element module 132 and a power sensor module 136. In one embodiment of the invention, transmitter section 112 further includes a gain determination module 140, while baseband processor 116 does not include the gain determination module 120. In yet another embodiment of the invention, both transmitter section 112 and baseband processor 116 include the gain determination modules 140 and 120, respectively. Additionally, any one of the power sensor module 136 or temperature sensor module 128 may be removed from transmitter section 112 and implemented as a separate circuit. In this embodiment, gain determination module 120 would attempt to adjust the gain of the adjustable gain element module 132 according to the module input received from transmitter section 112, while gain determination module 140 would continue to determine a gain level for the adjustable gain element module 132 for the remaining temperature sensor module 128 or power sensor module 136, respectively.

In operation, one of two modes may be selected. In a first mode, the transmitter section 112 attempts to maintain a constant output power level. Accordingly, power sensor module 136, in the embodiment of FIG. 4, monitors an output power level of power amplifier 124 and generates power level indications to gain determination module 140 (and in one embodiment, also to the gain determination module 120). The gain determination module(s) 140 and/or 120 then generate gain level input signals to adjustable gain element module 132 to increase or decrease its gain level output, thereby increasing or decreasing the output power level of power amplifier 124. In a second mode of operation, transmitter section 112 does not attempt to maintain a constant output power level from power amplifier 124. Rather, it attempts to maintain the transistor(s) of the power amplifier 124 in a reliable region of operation.

In the second mode of operation, temperature sensor module 128 determines a temperature of power amplifier 124 and generates an indication of the detected temperature to the gain determination modules 140 and/or 120. Gain determination modules 140 and/or 120 therefore generate gain level input to adjustable gain element module 132 to increase or decrease the corresponding gain level output to increase or decrease the output power level of the power amplifier 124. For example, if the temperature sensor module 128 indicates that the power amplifier 124 is hot and has a temperature that exceeds a specified threshold, which specified threshold is selected to keep the transistor of the power amplifier 124 within the reliable region, the gain determination modules 140 and/or 120 will generate gain level inputs to adjustable gain element module 132 to reduce its gain level output, thereby reducing the output power level of power amplifier 124 to reduce its operating temperature to keep the highest reliability y.

Figure 5:
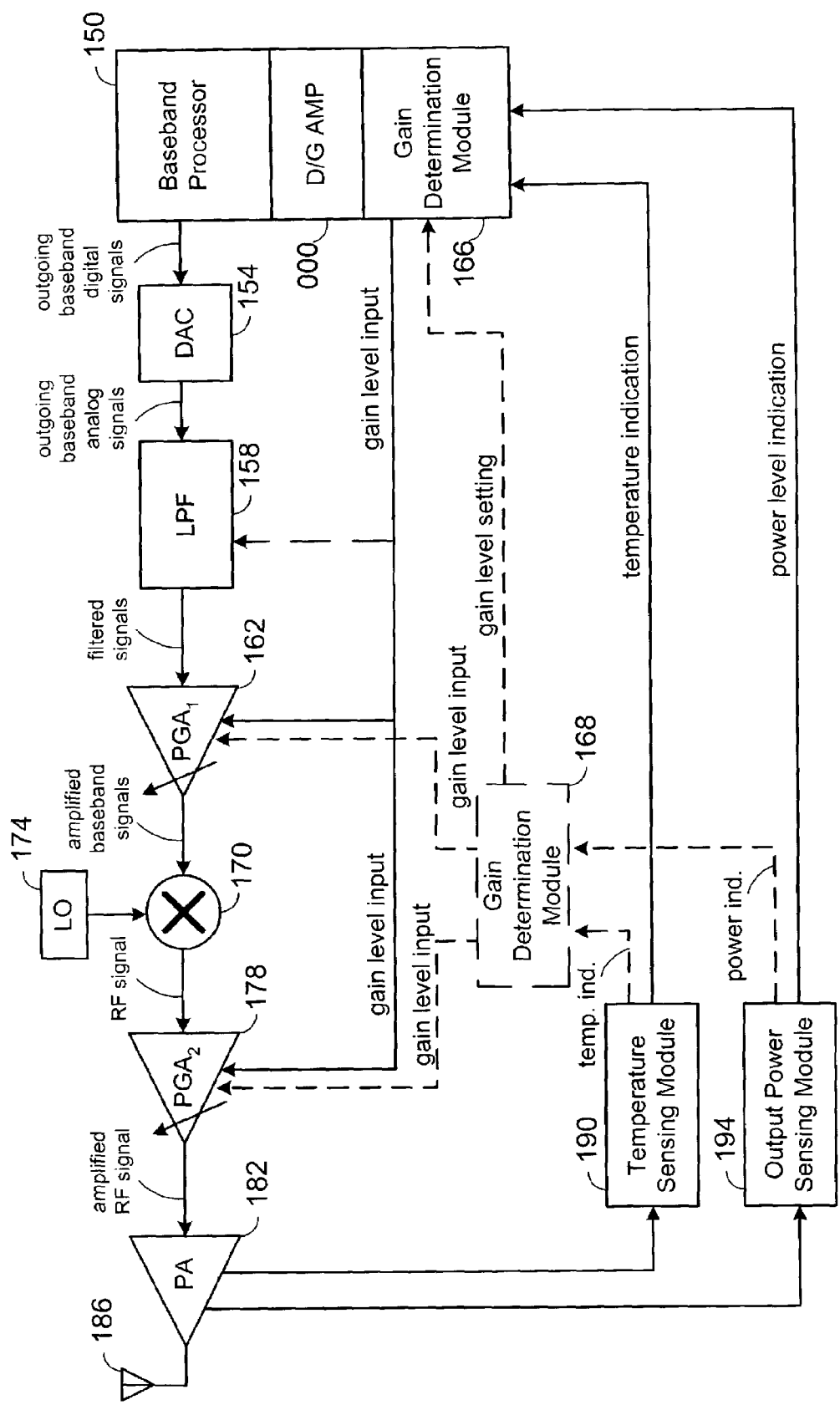
FIG. 5 is a functional schematic block diagram illustrating one embodiment of the present invention.

FIG. 5 is a functional schematic block diagram illustrating one embodiment of the present invention. A baseband processor 150 is coupled to produce outgoing baseband digital signals to a digital-to-analog converter module 154 that converts the outgoing digital baseband signals to outgoing (continuous waveform) baseband analog signals. The outgoing baseband analog signals are produced from the digital-to-analog converter module 154 to low pass filter 158. In the described embodiment of the invention, low pass filter 158 not only provides specified filtering, but also provides amplification at a fixed gain level. In an alternate embodiment of the invention, however, low pass filter 158 provides the variable amplification level. Low pass filter 158 generates filtered signals to a first programmable gain amplifier 162.

Programmable gain amplifier 162 is coupled to receive the filtered signals and to provide a specified amount of gain responsive to a received gain level input. In the described embodiment of the invention, the received gain level input is generated by a gain determination module 166 within baseband processor 150. In an alternate embodiment of the invention, the gain level input is generated by a gain level determination module 168 that is external to baseband processor 150. In yet another embodiment, both gain determination modules 168 and 166 generate gain level inputs that are jointly provided to some or all of the variable gain amplification devices. Programmable gain amplifier 162, responsive to receiving one or more gain level inputs, provides an amplified baseband signal to a mixer 170. Mixer 170 further is coupled to receive a local oscillation from a local oscillator 174 to up-convert the amplified baseband signal received from programmable gain amplifier 162. Mixer 170 produces a radio frequency signal that is produced to a second programmable gain amplifier 178. Programmable gain amplifier 178 then provides a specified amount of amplification responsive to a received gain level input. As before, the received gain level input is generated by gain determination module 166 within baseband processor 150 or by gain determination module 168. In one embodiment of the invention, programmable gain amplifiers 178 and 162 receive the same gain level input generated by gain determination modules 166 and 168. In an alternate embodiment of the invention, gain determination modules 166 and 168 generate separate gain level inputs for programmable gain amplifiers 162 and 178, respectively.

Programmable gain amplifier 178 then provides an amplified RF signal to a power amplifier 182. Power amplifier 182 then further amplifies the amplified RF signal received from programmable gain amplifier 178 to a specified output power level. The output of power amplifier 182 is then produced to an antenna 186 where it is radiated outwardly.

A temperature sensor 190 is placed proximate to power amplifier 182 so that it is thermodynamically coupled to power amplifier 182. Accordingly, temperature sensor 190 is able to monitor and detect a temperature of power amplifier 182 and to produce a temperature indication to gain determination module 166 of baseband processor 150 (or to gain determination module 168). An output power sensor module 194 is coupled to detect an output power level of power amplifier 182. Output power sensor module 194 generates an indication of the output power level of power amplifier 182 to gain determination module 166. Gain determination module 166 is operable to determine and generate gain level input signals to programmable gain amplifiers 162 and 178 according to the received temperature indication and the received power level indication.

In one embodiment of the invention, gain determination module 166 generates the gain level inputs responsive to only one of either the temperature indication or the power level indication, but not both. Baseband processor 150, in this embodiment, receives a gain determination mode input, as selected by a user, to determine whether it generates gain level inputs according to the temperature indication or the power level indication. In an alternate embodiment of the invention, gain determination module 166 generates gain level inputs responsive to both the temperature indication and the power level indication. In yet another embodiment of the present invention, gain determination module 166 includes computer instructions that are executed by baseband processor 150 to execute the logic for defining the gain level inputs. Accordingly, a user specifies whether the gain determination module 166 (or gain determination module 168 in an alternate embodiment of the invention) responds to temperature indications or power level indications by downloading a corresponding set of computer instructions to achieve the desired operation.

Figure 6:
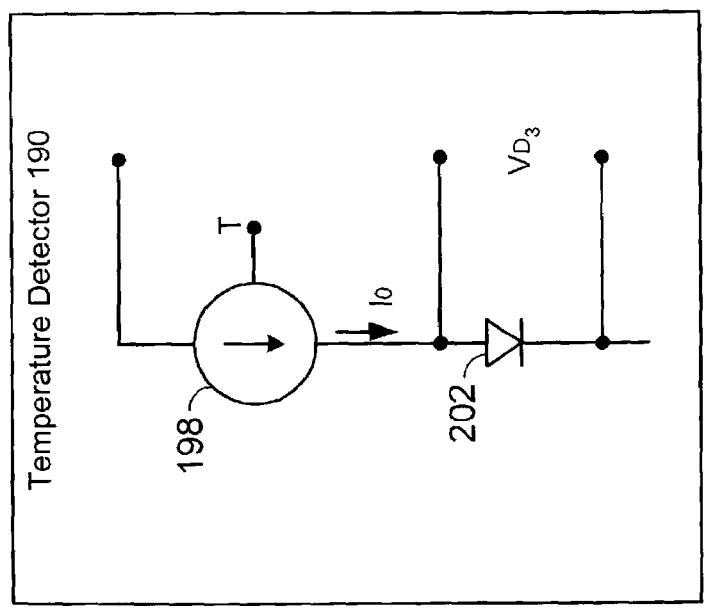
FIG. 6 is a schematic block diagram of a temperature detector according to one aspect of the present invention.

FIG. 6 is an schematic diagram illustrating one examplary aspect of the present invention of a temperature sensor module 190 . Temperature sensor module 190 includes a constant current source 198 that produces a current $I_O$. Current $I_O$ generated by current source 198 is produced to the input of a diode 202. For room temperature operation, a constant current $I_O$ will generate a voltage drop across diode 202 equal to $V_{D3}$. As the temperature of diode 202 increases, however, the voltage across diode 202 will decrease for a constant current $I_O$.

Figure 7:
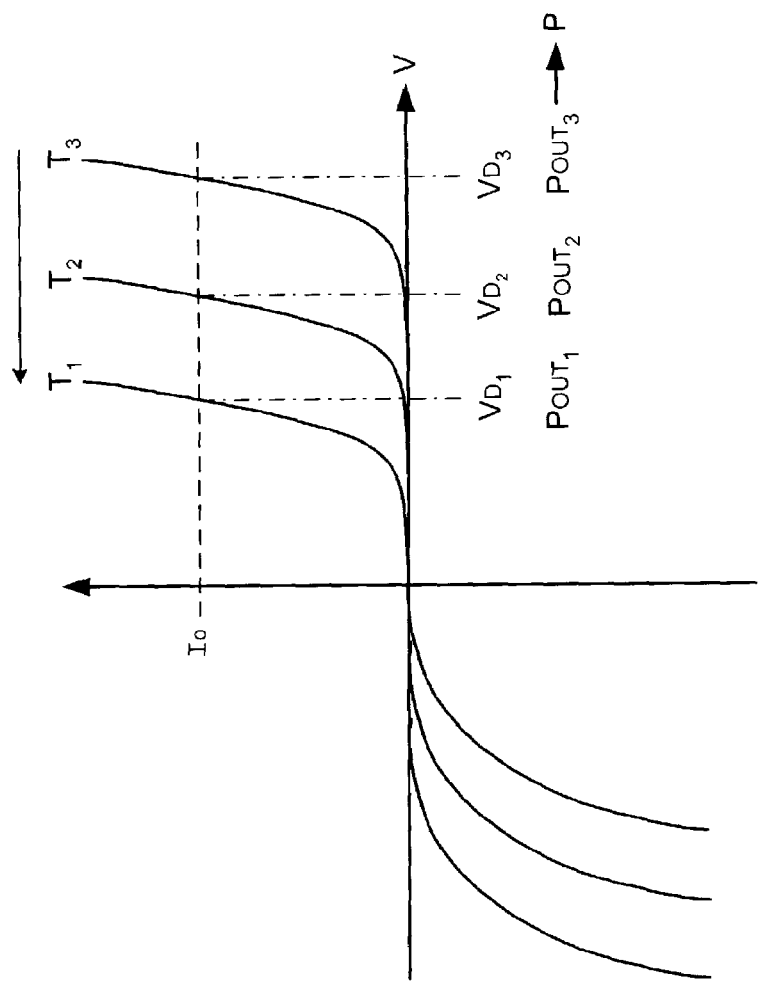
FIG. 7 is a set of curves illustrating the relationship between a constant current $I_o$, temperature and a voltage drop across a diode.

FIG. 7 is a set of curves illustrating the relationship between a constant current $I_O$, temperature and a voltage drop across a diode. More specifically, the set of temperature and voltage response curves of FIG. 7 show, for a constant current $I_O$, that the voltage $V_D$ drops according to the temperature T. Thus, for a temperature $T_3$, a corresponding voltage of $V_{D3}$ is shown. Similarly, a voltage drop of $V_{D2}$ is shown for an increased temperature $T_2$ (relative to $T_3$) and the voltage drop $V_{D1}$ is shown for an increased temperature $T_1$ (relative to $T_2$). As is further shown in FIG. 7, the temperature $T_1$ is higher in magnitude than the temperatures $T_2$ and $T_3$. Similarly, the voltage drop $V_{D3}$ is higher than the voltage drops $V_{D2}$ and $V_{D1}$. Corresponding output power levels $P_{OUT1}$, $P_{OUT2}$ and $P_{OUT3}$ are shown to correspond with voltage drops $V_{D1}$, $V_{D2}$ and $V_{D3}$, respectively wherein $P_{OUT3} > P_{OUT2} > P_{OUT1}$.

Figure 8:
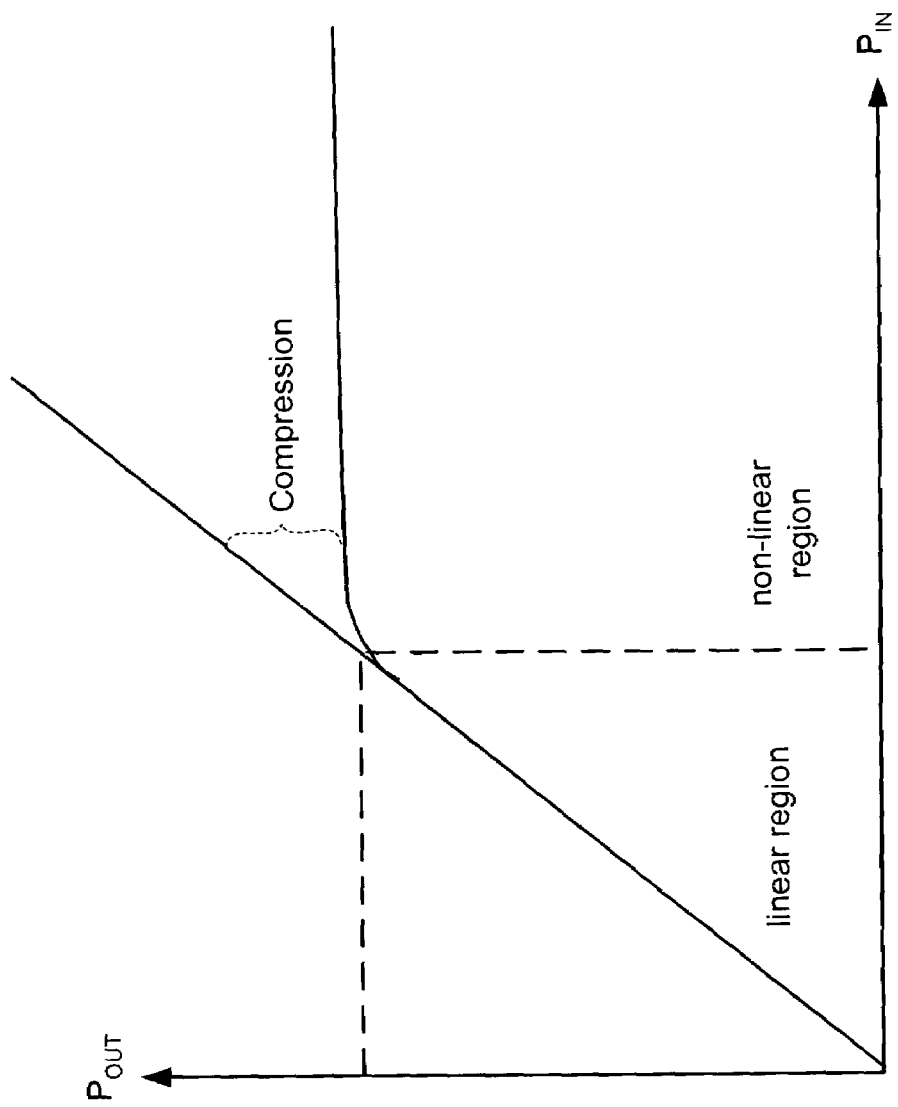
FIG. 8 is a power response curve that shows yet a non-linear effect of an amplifier.
Figure 9:
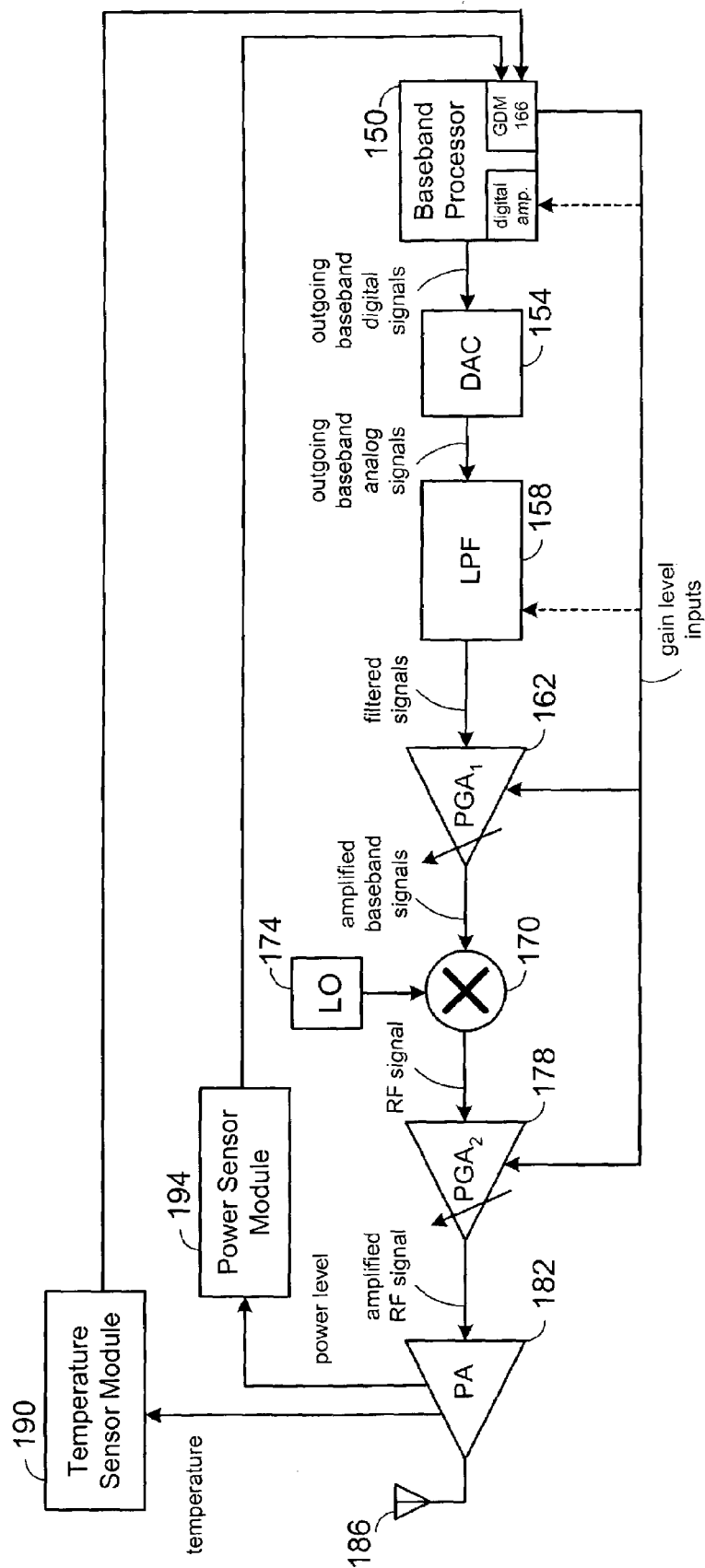
FIG. 9 is a functional schematic block diagram illustrating one embodiment of the present invention.

FIG. 8 is a power response curve that shows yet another effect of non-linearity. As may be seen, the output power of a power amplifier does not linearly increase with input power. Approaching to a certain power level, the output power tends to saturate. While temperature changes, this curve will vary and that means for a giving input power, there is a temperature dependent variation in the output power. To achieve a reliable and/or constant output power operation, both temperature and power sensors are very helpful for maintaining operation in a desired manner FIG. 9 is a functional schematic block diagram illustrating one embodiment of the present invention. A baseband processor 150 provides outgoing baseband digital signals to a digital-to-analog converter module 154 that converts the outgoing baseband digital signals to outgoing baseband analog signals. The outgoing baseband analog signals are provided to low pass filter 158. In the described embodiment of the invention, low pass filter 158 not only provides specified filtering, but also provides amplification at a certain gain level. In an alternate embodiment of the invention, however, low pass filter 158 provides a variable amplification level. Low pass filter 158 generates filtered signals to a first programmable gain amplifier (adjustable gain element) 162. Programmable gain amplifier 162 is coupled to receive the filtered signals and to provide a specified amount of gain responsive to a received gain level input. In the described embodiment of the invention, the received gain level input is generated by a gain determination module 166 within baseband processor 150.

Programmable gain amplifier 162 then provides amplified baseband signals to a mixer 170. Mixer 170 further is coupled to receive a local oscillation from a local oscillator 174 to up-convert the amplified baseband signals received from programmable gain amplifier 162. Mixer 170 produces a radio frequency signal that is produced to a second programmable gain amplifier 178. Programmable gain amplifier 178 then provides a specified amount of amplification responsive to a received gain level input. As previously mentioned, the received gain level input is generated by gain determination module 166 within baseband processor 150.

In one embodiment of the invention, programmable gain amplifiers 178 and 162 receive the same gain level inputs generated by gain determination module 166. In an alternate embodiment of the invention, gain determination module 166 generates separate gain level inputs for each of the programmable gain amplifiers 162 and 178, respectively. Programmable gain amplifier 178 then provides an amplified RF signal to a power amplifier 182. Power amplifier 182 then amplifies the amplified RF signal received from programmable gain amplifier 178 to a corresponding output power level that is a function of the amplified RF signal gain level produced by programmable gain amplifier 178. The output of power amplifier 182 is then produced to an antenna 186 where it is radiated outwardly.

A temperature sensor module 190 is placed proximate to power amplifier 182 so that it is thermodynamically coupled to power amplifier 182. Accordingly, temperature sensor 190 is able to monitor and detect a temperature of power amplifier 182 and to produce a temperature indication to gain determination module 166 of baseband processor 150. An output power sensor module 194 is coupled to detect an output power level of power amplifier 182. Output power sensor module 194 generates an indication of the output power level of power amplifier 182 to gain determination module 166. Gain determination module 166 is operable to determine and generate gain level input signals to programmable gain amplifiers 162 and 178 according to the received temperature indication and the received power level indication. In one embodiment of the invention, gain determination module 166 generates the gain level inputs responsive to only one of the temperature indication and the power level indication, but not both. Baseband processor 150, in this embodiment, receives a gain determination mode input, as selected by a user, to determine whether it generates gain level inputs according to the temperature indication or the power level indication.

In an alternate embodiment of the invention, gain determination module 166 generates gain level inputs responsive to both the temperature indication and the power level indication. In yet another embodiment of the present invention, gain determination module 166 includes computer instructions that are executed by baseband processor 150 to execute the logic for defining the gain level inputs. Accordingly, a user specifies whether the gain determination module 166 responds to temperature indications or power level indications by downloading a corresponding set of computer instructions to achieve the desired operation. As may also be seen, gain determination module 166 further generates an internal gain level input to a digital amplifier formed within baseband processor 150.

Figure 10:
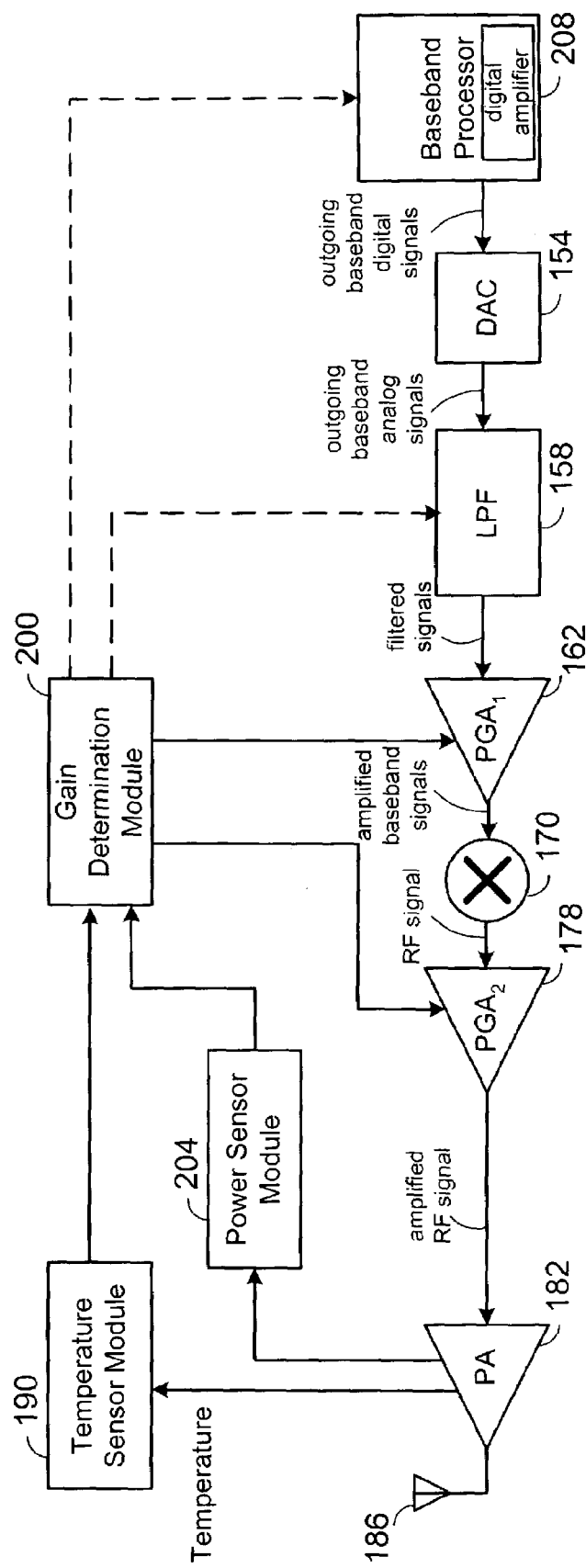
FIG. 10 is a functional schematic block diagram illustrating an alternate embodiment of the present invention.

FIG. 10 is a functional schematic block diagram illustrating an alternative embodiment of the present invention. A gain determination module 200 is coupled receive an indication of an output power level produced by a power amplifier from a power sensor module 204. A baseband processor 208 is coupled to produce outgoing baseband digital signals to a digital-to-analog converter module 154 that converts the outgoing baseband digital signals to outgoing baseband analog (continuous waveform) signals. The outgoing baseband analog signals are produced from digital-to-analog converter module 154 to low pass filter 158. In the described embodiment of the invention, low pass filter 158 not only provides specified filtering, but also provides amplification at a fixed gain level.

In an alternate embodiment of the invention, however, low pass filter 158 provides the variable gain level. Low pass filter 158 provides filtered signals to a first programmable gain amplifier 162. Programmable gain amplifier 162 is coupled to receive the filtered signals and to provide a specified amount of gain responsive to a received gain level input. In the described embodiment of the invention, the received gain level input is generated by a gain determination module 166 within baseband processor 208.

Programmable gain amplifier 162 then provides amplified baseband signals to a mixer 170. Mixer 170 further is coupled to receive a local oscillation from a local oscillator 174 to up-convert the amplified baseband signals received from programmable gain amplifier 162. Mixer 170 produces a radio frequency signal that is produced to a programmable gain amplifier 178. Programmable gain amplifier 178 then provides a specified amount of amplification responsive to a received gain level input.

Programmable gain amplifier 178 then generates an amplified RF signal to a power amplifier 182. Power amplifier 182 then amplifies the amplified RF signal received from programmable gain amplifier 178 to a specified output power level. The output of power amplifier 182 is then produced to an antenna 186 where it is radiated outwardly.

A temperature sensor module 190 is placed proximate to power amplifier 182 so that it is thermodynamically coupled to power amplifier 182. Accordingly, temperature sensor module 190 is able to monitor and detect a temperature of power amplifier 182 and to produce a temperature indication to gain determination module 200. Output power sensor module 204 generates the indication of the output power level of power amplifier 182 to gain determination module 200. Gain determination module 200 is operable to determine and generate gain level input signals to programmable gain amplifiers 162 and 178 according to the received temperature indication and the received power level indication. In one embodiment of the invention, gain determination module 200 generates the gain level inputs responsive to only one of either the temperature indication or the power level indication, but not both. In an alternate embodiment of the invention, gain determination module 200 generates gain level inputs responsive to both the temperature indication and the power level indication. In yet another embodiment of the present invention, gain determination module 200 includes computer instructions that define the logic for the gain level inputs. Accordingly, a user specifies whether the gain determination module 200 responds to temperature indications or power level indications by downloading a corresponding set of computer instructions to achieve the desired operation.

The embodiment as shown in FIG. 10 is similar to that of FIG. 9, with some differences. Gain determination module 166 of the baseband processor of FIG. 9 has been replaced by a gain determination module 200 that is formed in hardware external to the baseband processor. Accordingly, temperature sensor module 190 generates the temperature indication and produces it to gain determination module 200, while output power sensor module 204 generates a power level indication to gain determination module 200. Gain determination module 200 then generates gain level inputs to programmable gain amplifiers 162 and 178. Additionally, in one embodiment of the invention, gain determination module 200 generates gain level inputs to baseband processor 208 to prompt an internal digital amplifier to adjust its gain level output accordingly. In an alternate embodiment of the invention, gain determination module 200 further generates gain level inputs to low pass filter 158. Finally, gain determination module 200 generates gain level inputs that are produced to baseband processor 200 to prompt it (or, more specifically, to prompt the digital amplifier there within) to increase or decrease the digital gain of its outgoing digital baseband signals.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A direct conversion Radio Frequency (RF) transceiver integrated circuit comprising:
    a local oscillator that generates a RF local oscillation signal corresponding to a RF channel;
    a receiver section operably coupled to the local oscillator that receives an incoming RF signal and down converts the incoming RF signal based upon the RF local oscillation signal to produce a baseband signal;
    a transmitter section operably coupled to the local oscillator that receives an outgoing baseband signal and up converts the outgoing baseband signal to produce an outgoing RF signal; and
    wherein the transmitter section further comprises:
        a power amplifier;
        at least one adjustable gain element operably coupled on an input side of the power amplifier; and
        means for generating a gain level input to the at least one adjustable gain element wherein the means for generating a gain level input generates the gain level input based upon at least one of:
            an indication of the operating temperature of the power amplifier;
            an indication of the output power of the power amplifier; and
            an indication that power may be reduced to lower signal quality to a specified signal quality metric.

2. The direct conversion RF transceiver integrated circuit of claim 1 wherein the means for generating the gain level input to the at least one adjustable gain element comprises a baseband processor that executes computer instructions defining logic for generating the gain level input.

3. The direct conversion RF transceiver integrated circuit of claim 2 wherein the baseband processor is coupled to receive a control signal specifying whether the gain level input should be set according to either the indication of the operating temperature of the power amplifier or the indication of the output power of the power amplifier.

4. The direct conversion RF transceiver integrated circuit of claim 2 wherein the baseband processor generates the gain level input according to either the indication of the operating temperature of the power amplifier or the indication of the output power of the power amplifier, but not both.

5. The direct conversion RF transceiver integrated circuit of claim 1 wherein the at least one adjustable gain element comprises two programmable gain amplifiers.

6. The direct conversion RF transceiver integrated circuit of claim 5 wherein the at least one adjustable gain element comprises a baseband processor with a programmable digital output having adjustable gain.

7. The direct conversion RF transceiver integrated circuit of claim 5 wherein the at least one adjustable gain element comprises a low pass filter having adjustable gain.

8. The direct conversion RF transceiver integrated circuit of claim 5 wherein the indication of the operating temperature of the power amplifier is provided by a temperature detector.

9. The direct conversion RF transceiver integrated circuit of claim 8 wherein the indication of the output power of the power amplifier is provided by a power detector coupled to the power amplifier.

10. The direct conversion RF transceiver integrated circuit of claim 8 wherein the indication of the operating temperature of the power amplifier is provided by a temperature detector comprising a diode proximately coupled to the power amplifier and a voltage detector coupled to detect a voltage drop across the diode.

11. The direct conversion RF transceiver integrated circuit of claim 10 wherein the temperature detector further comprises a constant current source coupled to provide a constant current through the diode proximately coupled to the power amplifier.

12. In a Radio Frequency (RF) transceiver, a method for controlling a gain level of at least one variable gain device, the method comprising:

measuring an output power of a RF power amplifier;

measuring an approximate operating temperature of a RF power amplifier;

based upon at least one of the output power of the RF power amplifier and the approximate operating temperature and at least one operational characteristic of the RF power amplifier, determining at least one gain value, wherein a user specifies whether gain adjustments are made according to the output power of the RF power amplifier or according the approximate operating temperature and at least one operational characteristic of the RF power amplifier; and generating a gain control input for the at least one variable gain device based upon the at least one gain value.

13. The method of claim 12 where the gain control input is generated for a single programmable gain amplifier coupled on an input side of the RF power amplifier.

14. The method of claim 12 where the gain control input is generated for at least two programmable gain amplifiers coupled on an input side of the RF power amplifier.

15. The method of claim 12 where the gain control input is generated for a digital gain level output of a baseband processor.

16. The method of claim 12 wherein the user specifies whether the gain adjustments are made according to the output power of the RF power amplifier or according the approximate operating temperature and at least one operational characteristic of the RF power amplifier by installing computer instructions for execution by a baseband processor coupled to receive the computer instructions that define how the gain adjustments are made.

17. The method of claim 12 wherein the user specifies whether the gain adjustments are made according to the output power of the RF power amplifier or according the approximate operating temperature and at least one operational characteristic of the RF power amplifier by making a selection with a switch.

18. The method of claim 17 wherein the switch is a software switch.

19. The method of claim 17 wherein the switch is a hardware switch.

* * * * *